US012183575B2

(12) United States Patent
Park et al.

(10) Patent No.: US 12,183,575 B2
(45) Date of Patent: Dec. 31, 2024

(54) METHOD OF FABRICATING GALLIUM NITRIDE SUBSTRATE USING ION IMPLANTATION

(71) Applicant: IUCF-HYU (Industry-University Cooperation Foundation Hanyang University), Seoul (KR)

(72) Inventors: Jea Gun Park, Seongnam-si (KR); Tae Hun Shim, Suwon-si (KR); Jae Hyoung Shim, Seoul (KR); Jin Seong Park, Seoul (KR); Jae Un Lee, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 201 days.

(21) Appl. No.: 17/418,486

(22) PCT Filed: Sep. 30, 2019

(86) PCT No.: PCT/KR2019/012733
§ 371 (c)(1),
(2) Date: Jun. 25, 2021

(87) PCT Pub. No.: WO2020/138659
PCT Pub. Date: Jul. 2, 2020

(65) Prior Publication Data
US 2022/0115228 A1    Apr. 14, 2022

(30) Foreign Application Priority Data
Dec. 26, 2018  (KR) .................. 10-2018-0169008

(51) Int. Cl.
*H01L 21/02*    (2006.01)
*H01L 21/324*   (2006.01)

(52) U.S. Cl.
CPC .... *H01L 21/0254* (2013.01); *H01L 21/02013* (2013.01); *H01L 21/0262* (2013.01); *H01L 21/02694* (2013.01); *H01L 21/3245* (2013.01)

(58) Field of Classification Search
CPC .......... H01L 21/0254; H01L 21/02013; H01L 21/0262; H01L 21/02694; H01L 21/3245;
(Continued)

(56) References Cited

U.S. PATENT DOCUMENTS

| 7,488,385 B2 * | 2/2009 | Lahreche .......... H01L 21/76254 117/88 |
| 10,734,274 B2 * | 8/2020 | Hu ........................ H01L 21/762 |

(Continued)

FOREIGN PATENT DOCUMENTS

| JP | 2010-251776 A | 11/2010 |
| JP | 5003033 B2 | 8/2012 |

(Continued)

OTHER PUBLICATIONS

Hajime Fujikura et al., "Recent Progress of High-Quality GaN Substrates by HVPE Method", Proc. of SPIE, 2017, pp. 1-9, vol. 10104, 1010403.

(Continued)

*Primary Examiner* — Jay C Kim
*Assistant Examiner* — Woo K Lee
(74) *Attorney, Agent, or Firm* — Sughrue Mion, PLLC

(57) ABSTRACT

The present invention relates to technology for fabricating a gallium nitride substrate using an ion implantation process to which a self-separation technique is applied. According to the present invention, a method of fabricating a gallium nitride substrate may include a step of forming a first gallium (Continued)

nitride layer on a substrate, a step of implanting hydrogen ions into the first gallium nitride layer to form a separation layer, a step of grinding the edges of the substrate, the first gallium nitride layer, and the separation layer, a step of forming a second gallium nitride layer on the first gallium nitride layer having a ground edge, and a step of self-separating the second gallium nitride layer from the first gallium nitride layer having a ground edge.

5 Claims, 8 Drawing Sheets

(58) Field of Classification Search
CPC ............ H01L 21/304; H01L 21/76254; H01L 2924/1033
See application file for complete search history.

(56) References Cited

U.S. PATENT DOCUMENTS

| | | | | |
|---|---|---|---|---|
| 2002/0068201 | A1* | 6/2002 | Vaudo | C30B 25/02 427/256 |
| 2004/0195658 | A1* | 10/2004 | Nakayama | B24B 9/065 438/933 |
| 2011/0076836 | A1* | 3/2011 | Tauzin | H01L 21/76254 257/E21.568 |
| 2018/0138357 | A1 | 5/2018 | Henley | |
| 2018/0158720 | A1 | 6/2018 | Hu | |
| 2020/0321242 | A1* | 10/2020 | Hu | H01L 21/76254 |

FOREIGN PATENT DOCUMENTS

| | | |
|---|---|---|
| KR | 10-2001-0098328 A | 11/2001 |
| KR | 10-1119009 B1 | 3/2012 |
| KR | 10-2018-0054591 A | 5/2018 |

OTHER PUBLICATIONS

Korea Intellectual Property Office Grant of Patent for KR 10-2018-0169008 dated Jun. 26, 2019.

International Search Report for PCT/KR2019/012733 dated Jan. 9, 2020 [PCT/ISA/210].

* cited by examiner

[FIG. 1A]
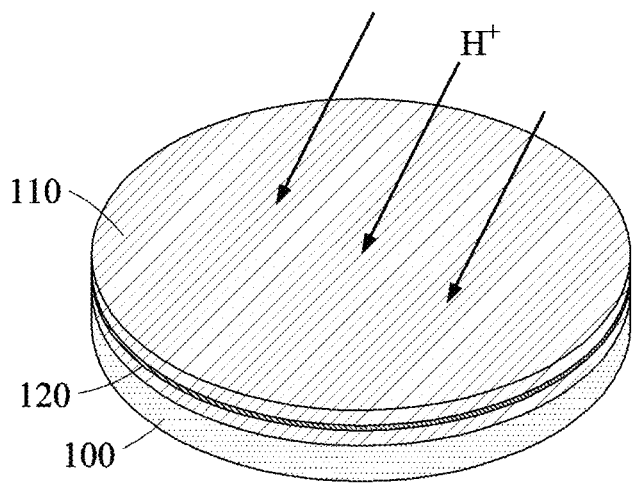
[FIG. 1B]
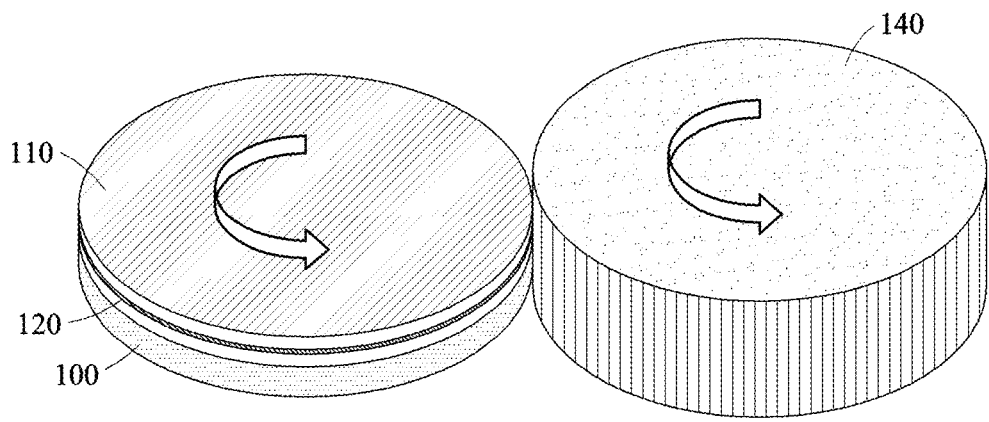

[FIG. 1C]
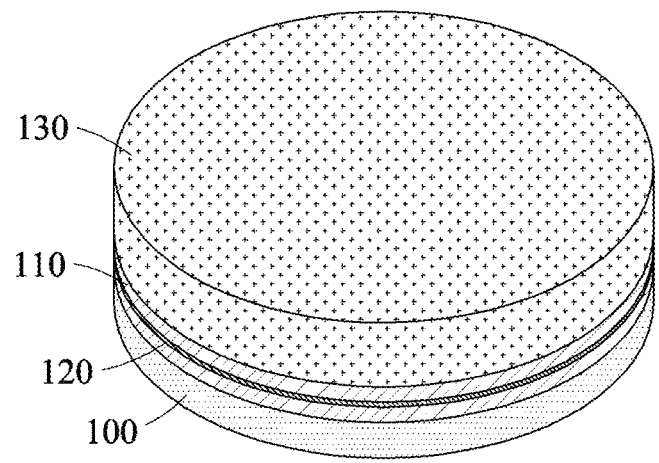
[FIG. 1D]
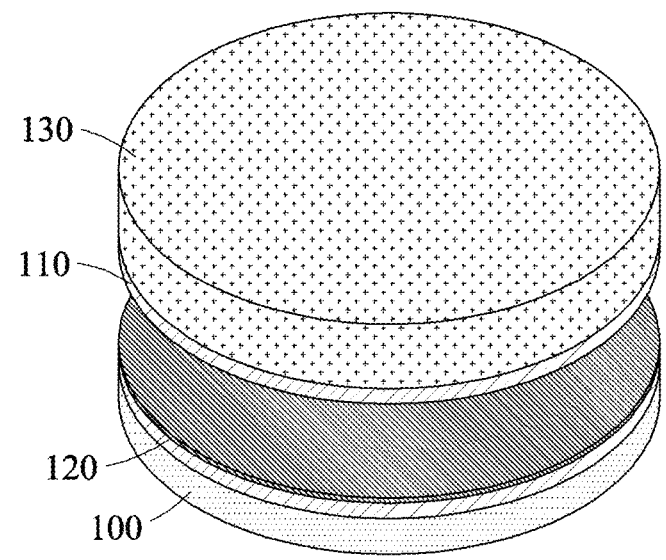

[FIG. 2A]
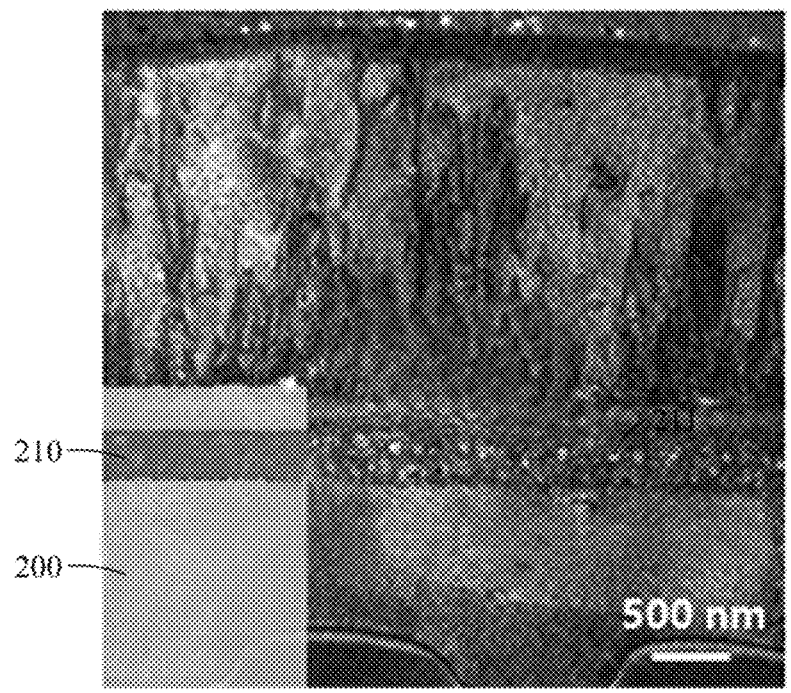
[FIG. 2B]
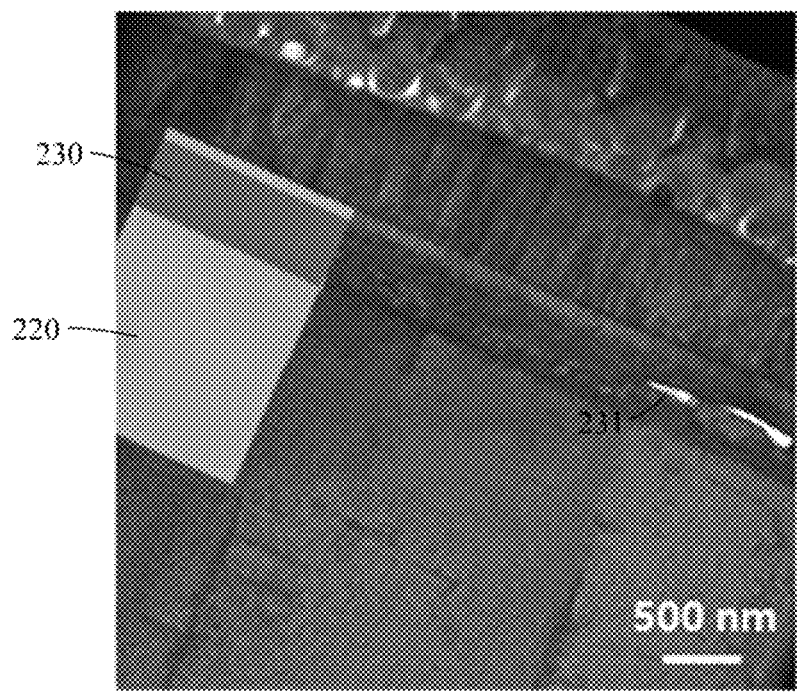

[FIG. 2C]
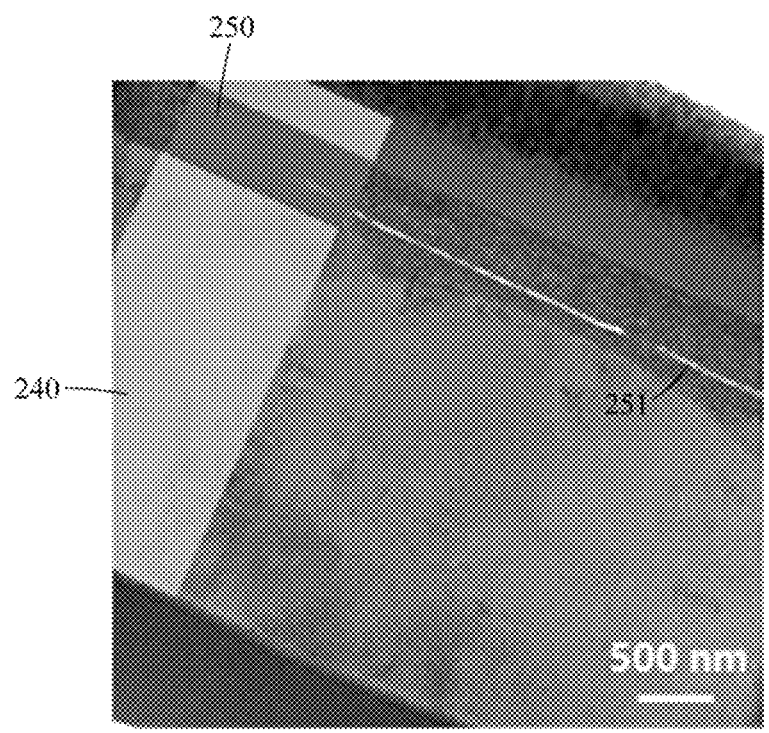
[FIG. 3]
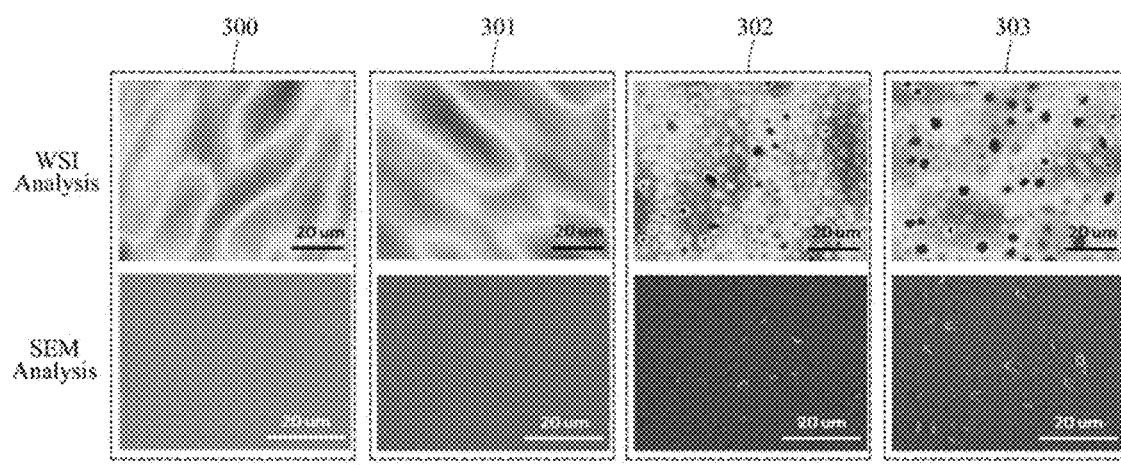

[FIG. 4]
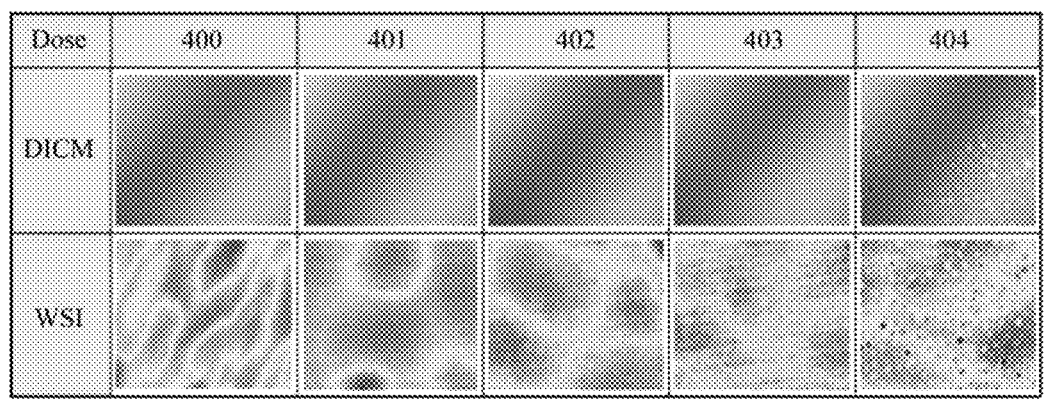
[FIG. 5]
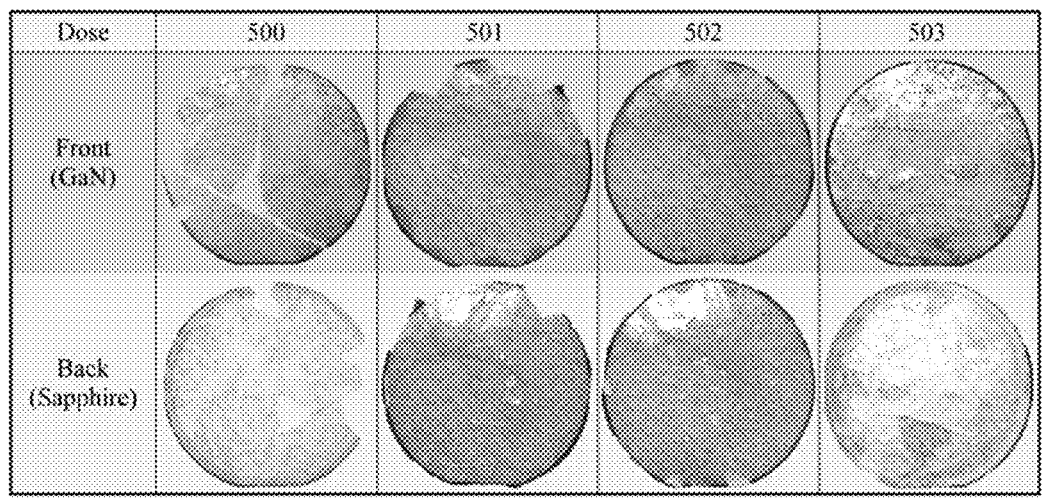

[FIG. 6A]
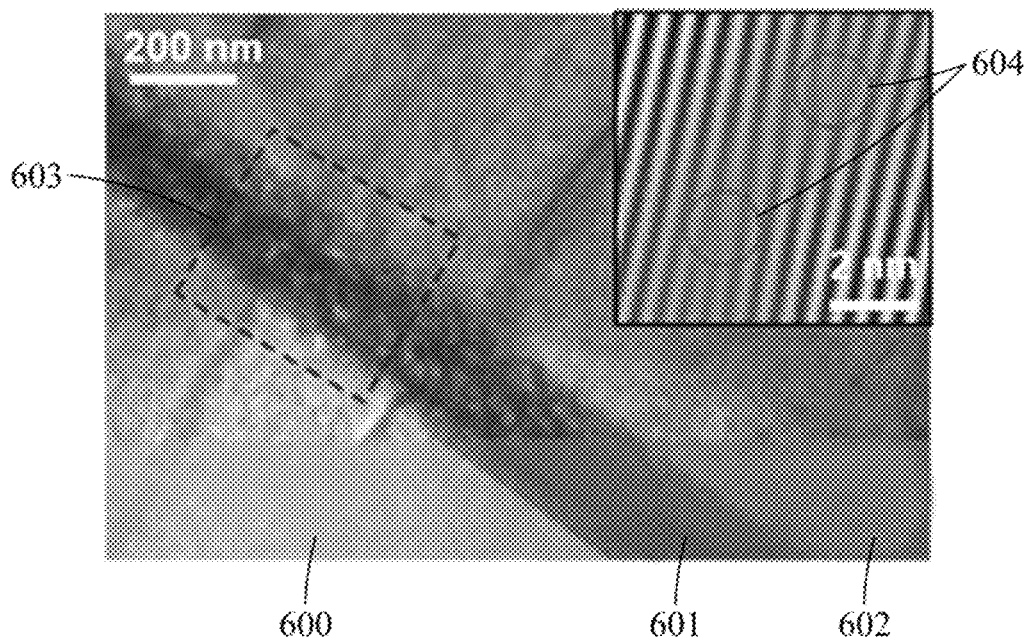
[FIG. 6B]
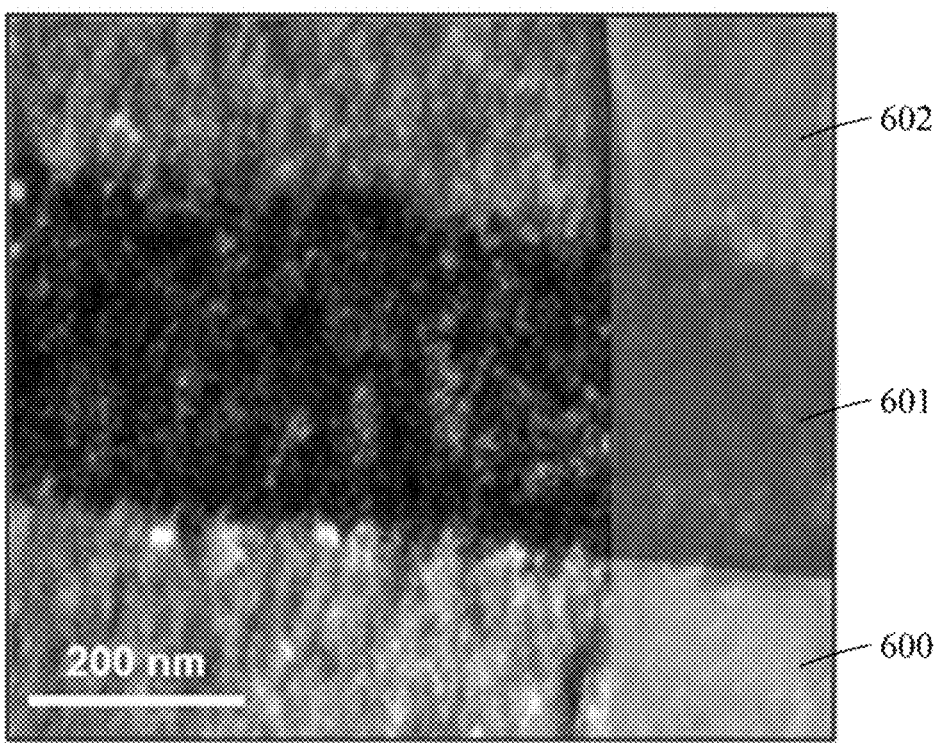

[FIG. 6C]
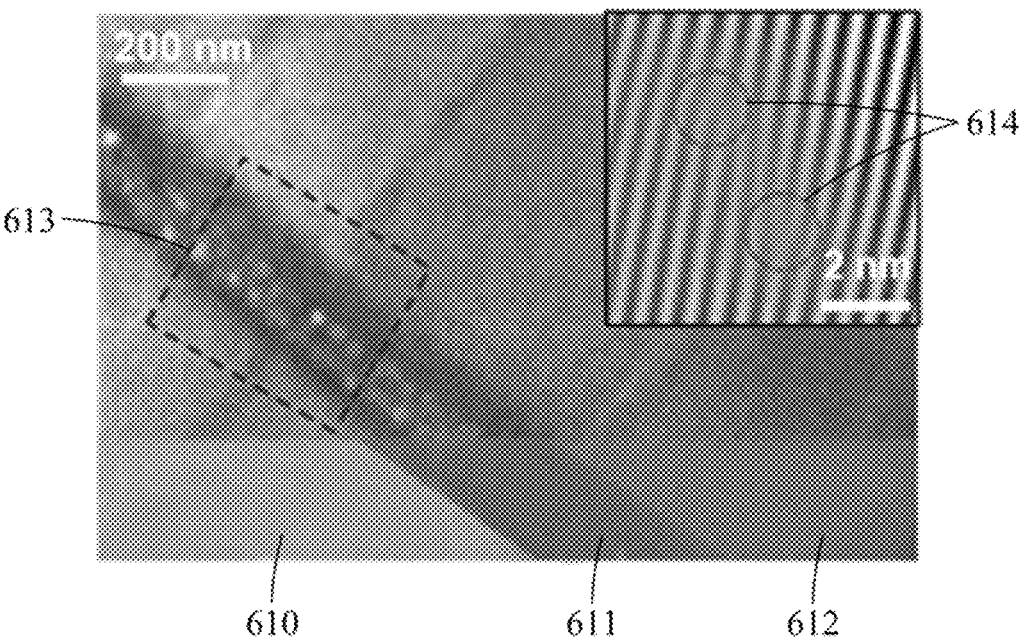
[FIG. 6D]
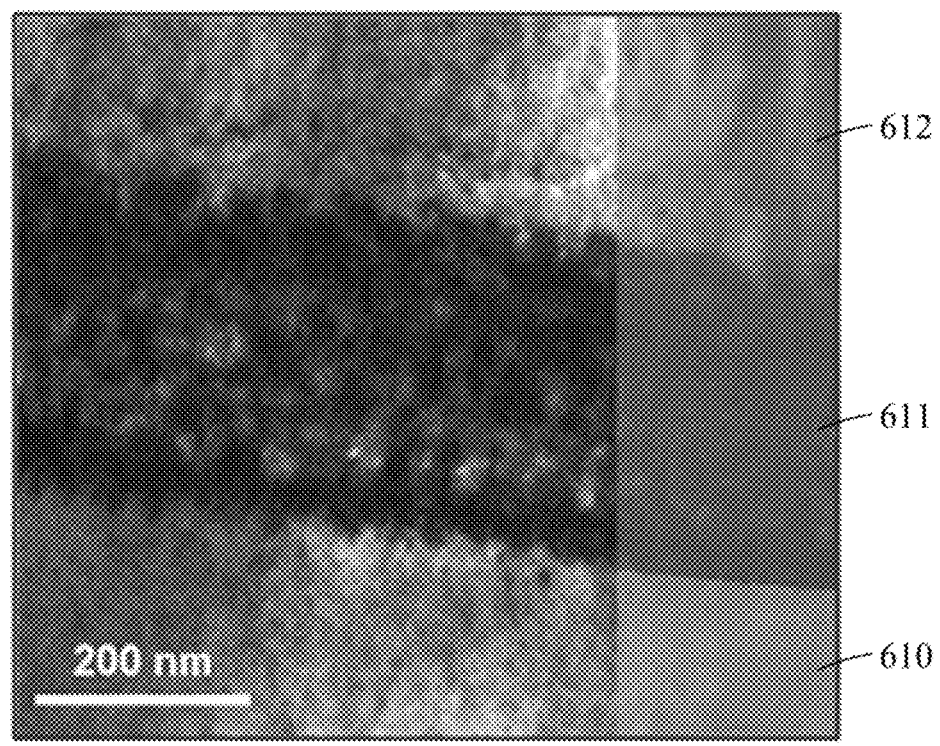

[FIG. 6E]
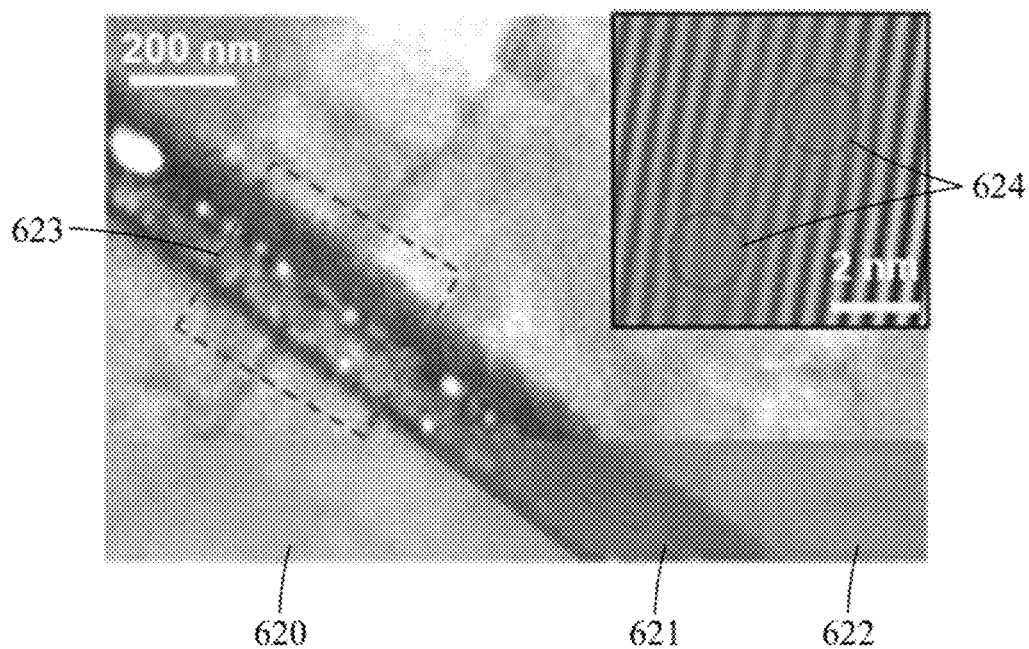
[FIG. 6F]
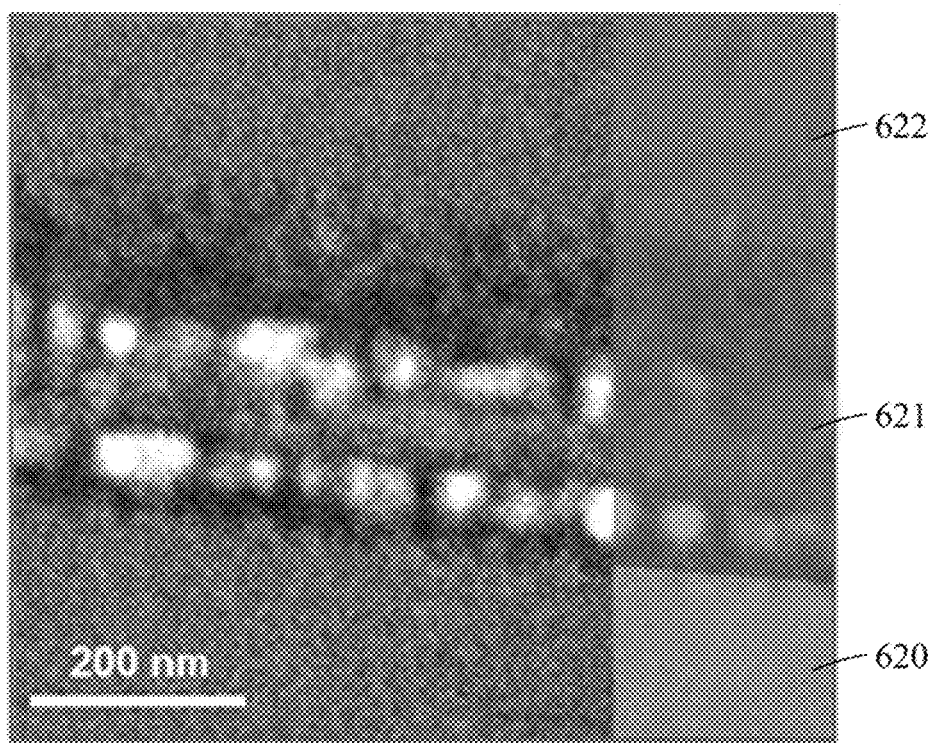

METHOD OF FABRICATING GALLIUM NITRIDE SUBSTRATE USING ION IMPLANTATION

CROSS-REFERENCE TO RELATED APPLICATION

This application is a National Stage Entry of PCT International Application No. PCT/KR2019/012733, which was filed on Sep. 30, 2019, and claims priority to Korean Patent Application No. 10-2018-0169008, filed on Dec. 26, 2018 in the Korean Intellectual Property Office, the disclosure of which is incorporated herein by reference.

TECHNICAL FIELD

The present invention relates to technology for fabricating a gallium nitride substrate using an ion implantation process to which a self-separation technique is applied. More specifically, the present invention relates to a method of fabricating a gallium nitride substrate through self-separation, characterized in that a conventional hydrogen heat treatment process is replaced by a hydrogen ion implantation process and an edge polishing process.

BACKGROUND ART

A free-standing gallium nitride (GaN) substrate may be used as a substrate for the fabrication of high-brightness light-emitting diodes (HB-LEDs), laser diodes (LDs), and high-power devices.

To improve the performance of devices such as high-brightness light-emitting diodes (HB-LEDs), laser diodes (LDs), and high-power devices, a high-quality gallium nitride substrate having a low dislocation density is required.

However, a gallium nitride membrane is grown at a high temperature of about 1,000° C. on a sapphire substrate and cooled to room temperature. At this time, as the thickness of the gallium nitride membrane increases, a very large stress may be generated between the different substrates due to the difference in thermal expansion coefficient (TEC) (e.g., gallium nitride=5.59 $10^{-6}$/K, sapphire=7.5 $10^{-6}$/K) and the difference in lattice constant (e.g., gallium nitride=3.189 Å, sapphire=4.758 Å).

Due to this stress, when the gallium nitride film is grown beyond a critical thickness, the substrate is broken during the growth process. Accordingly, it is very difficult to grow a thick gallium nitride film.

To grow high-quality gallium nitride having a thick thickness and a low dislocation density while suppressing cracking of a gallium nitride substrate, a self-separation technique may be used.

According to a conventional method of fabricating a free-standing gallium nitride substrate, a Ti thin film is deposited on the MOCVD-GaN surface of a metal-organic chemical vapor deposition (MOCVD)-GaN template substrate, a TiN nano-net is formed by performing heat treatment (annealing) for 30 minutes under the conditions of $H_2$ 80%+$NH_3$ 20% and 1,060° C., and then thermal degradation of the MOCVD-GaN layer is performed.

Thereafter, a hydride vapor phase epitaxy (HVPE)-GaN layer is grown on the MOCVD-GaN layer, and a process of self-separating the HVPE-GaN by cooling to room temperature is performed.

Therefore, in the case of the conventional method, the process is complex, which increases production costs.

In particular, since the conventional method includes a very dangerous process such as a hydrogen heat treatment process, accidents are highly likely to occur.

In addition, the conventional method may be limitedly applied to vertical HVPE equipment in which a specially designed susceptor is used.

That is, since the method of fabricating a free-standing gallium nitride substrate according to the prior art includes a complex growth process and a very dangerous process such as hydrogen heat treatment, accidents are highly likely to occur. In addition, it is inevitable to change the structure of the existing HVPE equipment or to manufacture new equipment, which may increase production costs.

DISCLOSURE

Technical Problem

Therefore, the present invention has been made in view of the above problems, and it is one object of the present invention to implant hydrogen ions into a first gallium nitride layer, grind the edges of the first gallium nitride layer and a substrate to prepare the seed layer capable of being separated automatically, and grow a second gallium nitride layer on the prepared seed layer to self-separate a gallium nitride substrate.

It is another object of the present invention to replace a conventional hydrogen heat treatment process with a hydrogen ion implantation process and an edge grinding process to self-separate a gallium nitride substrate.

It is still another object of the present invention to enable self-separation of a gallium nitride substrate using horizontal HVPE equipment without change in the structure of hydride vapor phase epitaxy (HVPE) equipment or a specially designed susceptor by suppressing growth of polycrystalline gallium nitride by grinding a first gallium nitride layer.

It is still another object of the present invention to enable self-separation of a gallium nitride substrate by forming a separation layer by implanting hydrogen ions at a predetermined dose into a first gallium nitride layer.

It is still another object of the present invention to provide a gallium nitride substrate having a threading dislocation density (TDD), which is a crystal defect, of about 2 orders of magnitude lower than that of a conventional MOCVD-GaN template substrate and having a thermal conductivity of about 2.6 times higher than that of the conventional MOCVD-GaN template substrate.

It is yet another object of the present invention to provide a gallium nitride substrate that may be used to fabricate semiconductor devices and high-brightness LEDs having characteristics such as high voltage, high power, and high frequency.

Technical Solution

In accordance with one aspect of the present invention, provided is a method of fabricating a gallium nitride substrate, the method including a step of forming a first gallium nitride layer on a substrate; a step of implanting hydrogen ions into the first gallium nitride layer to form a separation layer; a step of grinding edges of the substrate, the first gallium nitride layer, and the separation layer; a step of forming a second gallium nitride layer on the first gallium nitride layer having a ground edge; and a step of self-separating the second gallium nitride layer from the first gallium nitride layer having a ground edge.

The step of forming a first gallium nitride layer on a substrate may include a step of forming the first gallium nitride layer using a metal-organic chemical vapor deposition (MOCVD) process.

The step of implanting hydrogen ions into the first gallium nitride layer to form a separation layer may include a step of implanting hydrogen ions at a dose of 1.75 E17 $H^+/cm^2$ to 2.0 E17 $H^+/cm^2$ into the first gallium nitride layer to form the separation layer.

The step of implanting hydrogen ions into the first gallium nitride layer to form a separation layer may include a step of implanting hydrogen ions at a dose of 1.75 E17 $H^+/cm^2$ to 2.0 E17 $H^+/cm^2$ into the first gallium nitride layer to form a plurality of cavities inside the separation layer.

The step of self-separating the second gallium nitride layer may include a step of self-separating the second gallium nitride layer at room temperature based on the cavities.

The step of implanting hydrogen ions into the first gallium nitride layer to form a separation layer may include a step of implanting hydrogen ions at a dose of 1.75 E17 $H^+/cm^2$ to 2.0 E17 $H^+/cm^2$ into the first gallium nitride layer and then performing heat treatment at a temperature of 500° C. to form the separation layer.

The step of grinding edges of the substrate, the first gallium nitride layer, and the separation layer may include a step of grinding edges of the first gallium nitride layer and the substrate to suppress growth of polycrystalline gallium nitride from the edges of the first gallium nitride layer and the substrate or to weaken adhesion between the polycrystalline gallium nitride and the substrate.

The substrate may be formed using at least one of sapphire, gallium arsenide (GaAs), spinel, silicon (Si), indium phosphide (InP), and silicon carbide (SiC).

The step of forming a second gallium nitride layer on the first gallium nitride layer having a ground edge may include a step of forming the second gallium nitride layer using a hydride vapor phase epitaxy (HVPE) process.

Advantageous Effects

According to the present invention, hydrogen ions can be implanted into a first gallium nitride layer, the edges of the first gallium nitride layer and a substrate can be ground to prepare the seed layer capable of being separated automatically, and a second gallium nitride layer can be grown on the prepared seed layer to self-separate the gallium nitride substrate.

According to the present invention, a conventional hydrogen heat treatment process can be replaced with a hydrogen ion implantation process and an edge grinding process to self-separate a gallium nitride substrate.

According to the present invention, since growth of polycrystalline gallium nitride is suppressed by grinding a first gallium nitride layer, self-separation of a gallium nitride substrate can be performed using horizontal HVPE equipment without change in the structure of hydride vapor phase epitaxy (HVPE) equipment or a specially designed susceptor.

According to the present invention, since a separation layer is formed by implanting hydrogen ions at a predetermined dose into a first gallium nitride layer, a gallium nitride substrate can be self-separated.

The present invention can provide a gallium nitride substrate having a threading dislocation density (TDD), which is a crystal defect, of about 2 orders of magnitude lower than that of a conventional MOCVD-GaN template substrate and having a thermal conductivity of about 2.6 times higher than that of the conventional MOCVD-GaN template substrate.

The present invention can provide a gallium nitride substrate that can be used to fabricate semiconductor devices and high-brightness LEDs having characteristics such as high voltage, high power, and high frequency.

DESCRIPTION OF DRAWINGS

FIGS. 1A to 1D are drawings for explaining a method of fabricating a gallium nitride substrate according to one embodiment of the present invention.

FIGS. 2A to 2C are images for explaining change in a separation layer according to one embodiment of the present invention.

FIGS. 3 and 4 are images for explaining change in a first gallium nitride layer according to one embodiment of the present invention.

FIG. 5 includes images for explaining the growth result of a second gallium nitride layer according to one embodiment of the present invention.

FIGS. 6A to 6F are images for explaining change in a separation layer after growing a second gallium nitride layer according to one embodiment of the present invention.

BEST MODE

Specific structural and functional descriptions of embodiments according to the concept of the present invention disclosed herein are merely illustrative for the purpose of explaining the embodiments according to the concept of the present invention. Furthermore, the embodiments according to the concept of the present invention can be implemented in various forms and the present invention is not limited to the embodiments described herein.

The embodiments according to the concept of the present invention may be implemented in various forms as various modifications may be made. The embodiments will be described in detail herein with reference to the drawings. However, it should be understood that the present invention is not limited to the embodiments according to the concept of the present invention, but includes changes, equivalents, or alternatives falling within the spirit and scope of the present invention.

The terms such as "first" and "second" are used herein merely to describe a variety of constituent elements, but the constituent elements are not limited by the terms. The terms are used only for the purpose of distinguishing one constituent element from another constituent element. For example, a first element may be termed a second element and a second element may be termed a first element without departing from the teachings of the present invention.

It should be understood that when an element is referred to as being "connected to" or "coupled to" another element, the element may be directly connected or coupled to the other element or intervening elements may be present. In contrast, when an element is referred to as being "directly connected to" or "directly coupled to" another element, there are no intervening elements present. Other words used to describe the relationship between elements or layers should be interpreted in a like fashion (e.g., "between," versus "directly between," "adjacent," versus "directly adjacent," etc.).

The terms used in the present specification are used to explain a specific exemplary embodiment and not to limit the present inventive concept. Thus, the expression of singularity in the present specification includes the expression of plurality unless clearly specified otherwise in context. Also, terms such as "include" or "comprise" should be construed as denoting that a certain characteristic, number, step, operation, constituent element, component or a combination thereof exists and not as excluding the existence of or a possibility of an addition of one or more other characteristics, numbers, steps, operations, constituent elements, components or combinations thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, preferred embodiments of the present invention will be described in detail with reference to the accompanying drawings. However, the scope of the present invention is not limited by these embodiments. Like reference numerals in the drawings denote like elements.

FIGS. 1A to 1D are drawings for explaining a method of fabricating a gallium nitride substrate according to one embodiment of the present invention.

Referring to FIG. 1A, according to the method of fabricating a gallium nitride substrate, a first gallium nitride layer 110 is formed on a substrate 100 using a metal-organic chemical vapor deposition (MOCVD) process, and a separation layer 120 is formed by implanting hydrogen ions into the first gallium nitride layer 110.

According to one embodiment of the present invention, when the gallium nitride substrate is fabricated, the separation layer 120 may be formed by implanting hydrogen ions into the first gallium nitride layer 110 at a dose of 1.75 E17 $H^+/cm^2$ to 2.0 E17 $H^+/cm^2$.

For example, when the gallium nitride substrate is fabricated, a plurality of cavities may be formed inside the separation layer 120 by implanting hydrogen ions at a dose of 1.75 E17 $H^+/cm^2$ to 2.0 E17 $H^+/cm^2$. For example, the cavities may also be referred to as holes.

For example, a dose of 1.75 E17 $H^+/cm^2$ to 2.0 E17 $H^+/cm^2$ may represent an implantation amount of hydrogen ions implanted into the first gallium nitride layer 110, and the cavities may be formed to have a nanoscale diameter.

For example, the separation layer 120 may also be referred to as a hydrogen ion band.

For example, the first gallium nitride layer 110 may also be referred to as any one of an MOCVD-GaN layer or a seed layer.

According to one embodiment of the present invention, the substrate may be formed using at least one of sapphire, gallium arsenide (GaAs), spinel, silicon (Si), indium phosphide (InP), and silicon carbide (SiC).

For example, when the gallium nitride substrate is fabricated, hydrogen ions may be implanted into the first gallium nitride layer 110, and then heat treatment (annealing) may be performed at a temperature of about 500° C. for 30 minutes.

In addition, when the gallium nitride substrate is fabricated, a plurality of cavities may be formed in the separation layer 120 based on heat treatment.

Referring to FIG. 1B, when the gallium nitride substrate is fabricated, the edges of the substrate 100, the first gallium nitride layer 110, and the separation layer 120 may be ground using a grinder 140.

According to one embodiment of the present invention, when the gallium nitride substrate is fabricated, by grinding the edges of the first gallium nitride layer 110 and the substrate 100 using the grinder 140, growth of polycrystalline gallium nitride from the edges of the first gallium nitride layer 110 and the substrate 100 may be suppressed, or adhesion of polycrystalline gallium nitride to the substrate 100 may be weakened.

That is, when the gallium nitride substrate is fabricated, by grinding the edge of the first gallium nitride layer 110 formed based on the metal-organic chemical vapor deposition (MOCVD) process, growth of a second gallium nitride layer within a preset range may be allowed.

Referring to FIG. 1C, when the gallium nitride substrate is fabricated, the second gallium nitride layer 130 may be formed on the first gallium nitride layer 110 having a ground edge.

According to one embodiment of the present invention, when the gallium nitride substrate is fabricated, the second gallium nitride layer 130 may be formed on the first gallium nitride layer 110 using a hydride vapor phase epitaxy (HVPE) process.

In addition, when the gallium nitride substrate is fabricated, the hydride vapor phase epitaxy (HVPE) process may be performed through horizontal hydride vapor phase epitaxy equipment.

That is, according to the present invention, since growth of polycrystalline gallium nitride is suppressed by grinding the first gallium nitride layer, self-separation of the gallium nitride substrate may be performed using horizontal HVPE equipment without change in the structure of hydride vapor phase epitaxy (HVPE) equipment or a specially designed susceptor.

For example, when the gallium nitride substrate is fabricated, the second gallium nitride layer 130 may be formed on the first gallium nitride layer 110 using the first gallium nitride layer 110 as a seed layer.

For example, the second gallium nitride layer 130 may also be referred to as an HVPE-GaN layer.

Referring to FIG. 1D, when the gallium nitride substrate is fabricated, the second gallium nitride layer 130 may be self-separated from the first gallium nitride layer 110.

According to one embodiment of the present invention, when the gallium nitride substrate is fabricated, the second gallium nitride layer 130 may be grown on the first gallium nitride layer 110 at a temperature of about 500° C., and then may be cooled to room temperature. At this time, after a predetermined time, the second gallium nitride layer 130 may be self-separated from the first gallium nitride layer 110.

For example, the second gallium nitride layer 130 may be self-separated from the first gallium nitride layer 110 at room temperature based on a plurality of cavities formed inside the separation layer 120.

That is, the second gallium nitride layer 130 formed above the separation layer 120 may be self-separated at room temperature based on a plurality of cavities formed inside the separation layer 120.

That is, according to the present invention, hydrogen ions may be implanted into the first gallium nitride layer, the edge of the first gallium nitride layer may be ground to prepare the seed layer capable of being separated automatically, and the second gallium nitride layer may be grown on the prepared seed layer to self-separate the gallium nitride substrate.

In addition, according to the present invention, the conventional hydrogen heat treatment process may be replaced with the hydrogen ion implantation process and the edge grinding process to self-separate the gallium nitride substrate.

FIGS. 2A to 2C are images for explaining change in a separation layer according to one embodiment of the present invention.

More specifically, FIGS. 2A to 2C are images taken using a cross-sectional transmission electron microscope after implanting hydrogen ions on the surface of the first gallium nitride layer and performing heat treatment for 30 minutes at a temperature of about 500° C., which is the minimum temperature at which blisters are formed.

Referring to FIG. 2A, when a first gallium nitride layer 200 is formed on a substrate through a metal-organic chemical vapor deposition process, hydrogen ions at a dose of about 2.0 E17 $H^+/cm^2$ are implanted, and heat treatment is performed at a temperature of about 500° C. for about 30 minutes, a plurality of cavities 211 may be formed inside a separation layer 210.

Referring to FIG. 2B, when a first gallium nitride layer 220 is formed on a substrate through a metal-organic chemical vapor deposition process, hydrogen ions at a dose of about 3.0 E17 $H^+/cm^2$ are implanted, and heat treatment is performed at a temperature of about 500° C. for about 30 minutes, a plurality of blisters 231 may be formed inside a separation layer 230.

Referring to FIG. 2C, when a first gallium nitride layer 240 is formed on a substrate through a metal-organic chemical vapor deposition process, hydrogen ions at a dose of about 4.0 E17 $H^+/cm^2$ are implanted, and heat treatment is performed at a temperature of about 500° C. for about 30 minutes, a plurality of blisters 241 may be formed inside a separation layer 240.

Comparing FIGS. 2B and 2C, as the number of implanted hydrogen ions increases, the size of blisters may increase. When the size of the blisters increases, blisters 251 in a separation layer 250 may be formed in a cleaved form.

According to FIGS. 2A to 2C, implantation of hydrogen ions may be performed at an implantation energy of about 70 keV, and a projection range may be about 270 nm.

FIGS. 3 and 4 are images for explaining change in a first gallium nitride layer according to one embodiment of the present invention.

Specifically, FIG. 3 shows white-light scanning interferometry (WSI) and scanning electron microscope (SEM) analysis of the surface of the first gallium nitride layer.

Referring to FIG. 3, in the case of a group 300, hydrogen ions are not implanted into the first gallium nitride layer. In the case of a group 301, hydrogen ions at a dose of about 2.0 E17 $H^+/cm^2$ are implanted into the first gallium nitride layer. In the case of a group 302, hydrogen ions at a dose of about 3.0 E17 $H^+/cm^2$ are implanted into the first gallium nitride layer. In the case of a group 303, hydrogen ions at a dose of about 4.0 E17 $H^+/cm^2$ are implanted into the first gallium nitride layer.

For example, the surface state of the first gallium nitride layer implanted with hydrogen ions at a dose of 2.0 E17 $H^+/cm^2$ may be substantially the same as the surface state of the first gallium nitride layer not implanted with hydrogen ions. This may be verified by comparing the group 300 and the group 301.

In the WSI analysis results for the group 302 and the group 303, the dot shape may indicate a burst blister. As the dose of hydrogen ions increases, the number of burst blisters may increase. In addition, the same pattern is observed in the SEM analysis.

That is, when the number of burst blisters increases in the separation layer, cleaved patterns are observed inside the separation layer.

Specifically, FIG. 4 shows the surface state of the first gallium nitride layer according to change in the implantation amount of hydrogen ions observed by differential interference contrast microscope (DICM) analysis and WSI analysis.

Referring to FIG. 4, in the case of a group 400, hydrogen ions are not implanted into the first gallium nitride layer. In the case of a group 401, hydrogen ions at a dose of about 1.75 E17 $H^+/cm^2$ are implanted into the first gallium nitride layer. In the case of a group 402, hydrogen ions at a dose of about 2.0 E17 $H^+/cm^2$ are implanted into the first gallium nitride layer. In the case of a group 403, hydrogen ions at a dose of about 2.25 E17 $H^+/cm^2$ are implanted into the first gallium nitride layer. In the case of a group 404, hydrogen ions at a dose of about 2.5 E17 $H^+/cm^2$ are implanted into the first gallium nitride layer.

In the case of the groups 401 to 403, the separation layer is formed by implanting hydrogen ions into the first gallium nitride layer, and cavities are formed inside the separation layer, but blisters are not formed inside the separation layer. Meanwhile, in the case of the group 404, blisters are formed inside the separation layer.

FIG. 5 includes images for explaining the growth result of a second gallium nitride layer according to one embodiment of the present invention.

Specifically, FIG. 5 shows the results of forming the separation layer by implanting hydrogen ions into the first gallium nitride layer, and then growing the second gallium nitride layer.

Referring to FIG. 5, groups 500 to 503 each show the front and back of the separated second gallium nitride layer. In the case of the group 500, hydrogen ions are not implanted into the first gallium nitride layer. In the case of a group 501, hydrogen ions at a dose of about 1.75 E17 $H^+/cm^2$ are implanted into the first gallium nitride layer. In the case of a group 502, hydrogen ions at a dose of 2.0 E17 $H^+/cm^2$ are implanted into the first gallium nitride layer. In the case of the group 503, hydrogen ions at a dose of 2.25 E17 $H^+/cm^2$ are implanted into the first gallium nitride layer.

For example, the second gallium nitride layer may be grown to about 800 μm on the first gallium nitride layer, and the near surface of each group may exhibit a self-separation effect of the second gallium nitride layer according to hydrogen ion dose.

As shown in the group 500, local segregation is observed. However, after growth, cracks occur throughout the substrate, breaking the gallium nitride substrate.

Referring to the groups 501 to 503, unlike the group 500, cracks do not occur in the second gallium nitride layer into which hydrogen ions of a specific dose or more are implanted.

In particular, under the conditions of 1.75 E17 $H^+/cm^2$ and 2.0 E17 $H^+/cm^2$ corresponding to the group 501 and the group 502, respectively, 95% or more of the area of the second gallium nitride layer may be successfully self-separated.

In addition, under the dose condition of 2.25 E17 W/cm² corresponding to the group 503, about 63% of an area is separated. However, since a non-separated portion is wide, it may be difficult to obtain an intact second gallium nitride layer.

FIGS. 6A to 6F are images for explaining change in a separation layer after growing a second gallium nitride layer according to one embodiment of the present invention.

Specifically, FIGS. 6A and 6B show transmission electron microscope images of the separation layer when hydrogen ions at a dose of 1.75 E17 $H^+/cm^2$ are implanted, FIGS. 6C and 6D show transmission electron microscope images of the separation layer when hydrogen ions at a dose of 2.0 E17 $H^+/cm^2$ are implanted, and FIGS. 6E and 6F show transmission electron microscope images of the separation layer when hydrogen ions at a dose of 2.25 E17 $H^+/cm^2$ are implanted.

Referring to FIGS. 6A and 6B, a first gallium nitride layer 600, a separation layer 601, and a second gallium nitride layer 602 may be formed, and cavities 604 may be formed in an area 603 of the separation layer 601.

That is, when hydrogen ions at a dose of 1.75 E17 $H^+/cm^2$ are implanted into the first gallium nitride layer 600, the nanoscale cavities 604 may be formed in the separation layer 601.

Referring to FIGS. 6C and 6D, a first gallium nitride layer 610, a separation layer 611, and a second gallium nitride layer 612 may be formed, and cavities 614 may be formed in an area 613 of the separation layer 611.

That is, when hydrogen ions at a dose of 2.0 E17 $H^+/cm^2$ are implanted into the first gallium nitride layer 610, the nanoscale cavities 614 may be formed in the separation layer 611.

In this case, the cavities 614 may be larger than the cavities 604.

Referring to FIGS. 6E and 6F, a first gallium nitride layer 620, a separation layer 621, and a second gallium nitride layer 622 may be formed, and cavities 624 may be formed in an area 623 of the separation layer 621.

That is, when hydrogen ions at a dose of 2.25 E17 $H^+/cm^2$ are implanted into the first gallium nitride layer 620, the cavities 624 may be formed in the separation layer 621.

In addition, the size of the cavities 624 of the area 623 may be significantly increased, and thus the cavities 624 may exhibit a different shape compared to the cavities 604 and the cavities 614.

That is, the shape of the separation layer may be changed according to the dose of hydrogen ions, which may be related to the self-separation ability of the second gallium nitride layer.

That is, according to the present invention, since the separation layer is formed by implanting hydrogen ions at a predetermined dose into the first gallium nitride layer, a gallium nitride substrate may be self-separated.

In addition, the present invention may provide the gallium nitride substrate having a threading dislocation density (TDD), which is a crystal defect, of about 2 orders of magnitude lower than that of a conventional MOCVD-GaN template substrate and having a thermal conductivity of about 2.6 times higher than that of the conventional MOCVD-GaN template substrate.

In addition, the present invention may provide the gallium nitride substrate that may be used to fabricate semiconductor devices and high-brightness LEDs having characteristics such as high voltage, high power, and high frequency.

Although the present invention has been described with reference to limited embodiments and drawings, it should be understood by those skilled in the art that various changes and modifications may be made therein. For example, the described techniques may be performed in a different order than the described methods, and/or components of the described systems, structures, devices, circuits, etc., may be combined in a manner that is different from the described method, or appropriate results may be achieved even if replaced by other components or equivalents.

Therefore, other embodiments, other examples, and equivalents to the claims are within the scope of the following claims.

The invention claimed is:

1. A method of fabricating a gallium nitride substrate, comprising:
a step of forming a first gallium nitride layer on a substrate;
a step of implanting hydrogen ions into the first gallium nitride layer to form a separation layer;
a step of grinding edges of the substrate, the first gallium nitride layer, and the separation layer;
a step of forming a second gallium nitride layer on the first gallium nitride layer having a ground edge; and
a step of separating the second gallium nitride layer from the first gallium nitride layer having the ground edge,
wherein the step of implanting hydrogen ions into the first gallium nitride layer to form the separation layer comprises a step of implanting hydrogen ions at a dose of 1.75 E17 $H^+/cm^2$ to 2.0 E17 $H^+/cm^2$ into the first gallium nitride layer and then performing heat treatment at a temperature of about 500° C. for about 30 minutes, to form the separation layer and to form a plurality of cavities inside the separation layer,
the step of forming a second gallium nitride layer comprises a step of growing the second gallium nitride layer of about 800 μm on the first gallium nitride layer having the ground edge using the first gallium nitride layer having the ground edge as a seed layer,
the step of separating the second gallium nitride layer comprises a step of separating the second gallium nitride layer at room temperature based on the cavities,
the step of implanting is performed under the conditions where implantation of hydrogen ions is carried out at an implantation energy of about 70 keV, and a projection range is about 270 nm, and
the second gallium nitride layer, under the conditions of 1.75E17 $H^+/cm^2$ and 2.0E17 $H^+/cm^2$, is separated, with 95% or more of the area.

2. The method according to claim 1, wherein the step of forming the first gallium nitride layer on the substrate comprises a step of forming the first gallium nitride layer using a metal-organic chemical vapor deposition (MOCVD) process.

3. The method according to claim 1, wherein the step of grinding edges of the substrate, the first gallium nitride layer, and the separation layer comprises a step of grinding edges of the first gallium nitride layer and the substrate to suppress growth of polycrystalline gallium nitride from the edges of the first gallium nitride layer and the substrate or to weaken adhesion between the polycrystalline gallium nitride and the substrate.

4. The method according to claim 1, wherein the substrate is formed using at least one of sapphire, gallium arsenide (GaAs), spinel, silicon (Si), indium phosphide (InP), and silicon carbide (SiC).

5. The method according to claim 1, wherein the step of forming the second gallium nitride layer on the first gallium nitride layer having the ground edge comprises a step of forming the second gallium nitride layer using a hydride vapor phase epitaxy (HVPE) process.

\* \* \* \* \*